United States Patent [19]
McKee et al.

[11] Patent Number: 6,143,072
[45] Date of Patent: Nov. 7, 2000

[54] GENERIC PROCESS FOR PREPARING A CRYSTALLINE OXIDE UPON A GROUP IV SEMICONDUCTOR SUBSTRATE

[75] Inventors: Rodney A. McKee, Kingston; Frederick J. Walker; Matthew F. Chisholm, both of Oak Ridge, all of Tenn.

[73] Assignee: UT-Battelle, LLC, Oak Ridge, Tenn.

[21] Appl. No.: 09/286,798

[22] Filed: Apr. 6, 1999

[51] Int. Cl.$^7$ ............................................. C30B 23/06
[52] U.S. Cl. .................................. 117/108; 117/944
[58] Field of Search ..................... 117/84, 108, 92, 117/103, 104, 944

[56] References Cited

U.S. PATENT DOCUMENTS

| | | | |
|---|---|---|---|
| 5,089,862 | 2/1993 | Warner, Jr. et al. | 357/23.1 |
| 5,225,031 | 7/1993 | McKee et al. | 156/612 |
| 5,248,633 | 9/1993 | Morar et al. | 437/196 |
| 5,482,003 | 1/1996 | McKee et al. | 117/108 |
| 5,830,270 | 11/1998 | McKee et al. | 117/106 |

*Primary Examiner*—Benjamin L. Utech
*Assistant Examiner*—Matthew Anderson
*Attorney, Agent, or Firm*—Michael E. McKee; George L. Craig; Joseph A. Marasco

[57] ABSTRACT

A process for growing a crystalline oxide epitaxially upon the surface of a Group IV semiconductor, as well as a structure constructed by the process, is described. The semiconductor can be germanium or silicon, and the crystalline oxide can generally be represented by the formula $(AO)_n(A'BO_3)_m$ in which "n" and "m" are non-negative integer repeats of planes of the alkaline earth oxides or the alkaline earth-containing perovskite oxides. With atomic level control of interfacial thermodynamics in a multicomponent semiconductor/oxide system, a highly perfect interface between a semiconductor and a crystalline oxide can be obtained.

4 Claims, 2 Drawing Sheets

GENERIC PROCESS FOR PREPARING A CRYSTALLINE OXIDE UPON A GROUP IV SEMICONDUCTOR SUBSTRATE

This invention was made with Government support under Contract No. DE-AC05-96OR22464 awarded by the U.S. Department of Energy to Lockheed Martin Energy Research Corporation, and the Government has certain rights in the invention.

BACKGROUND OF THE INVENTION

This invention relates generally to the preparation of structures utilizing a semiconductor-based substrate and relates, more particularly, to the formation of crystalline oxide thin films upon a substrate comprised of a Group IV material, such as germanium or silicon.

In U.S. Pat. No. 5,225,031, we described a process for depositing an oxide epitaxially onto a silicon substrate so that the structures which result from the process would be suitable for use in semiconductor and related applications. However, such a discussion was limited to the build-up of a crystalline oxide on silicon, a Group IV semiconductor material.

For use in some semiconductor devices, such as a transistor, having an epitaxial build-up of a crystalline oxide onto a semiconductor-based substrate, a germanium substrate is likely to provide better operating characteristics than those provided by a silicon substrate. For example, the electron hole mobility of germanium (related to the gain coefficient of the material) and which corresponds to the speed at which current can flow through the material is about four times higher in germanium than in silicon. Along the same lines, the switching speed (again, a function of electron hole mobility) is about four times faster in germanium than in silicon. Consequently, a transistor whose substrate is comprised of germanium could theoretically be switched about four times faster than a transistor having a silicon substrate. Therefore, it would be desirable to provide a generic process which can be used for constructing a crystalline oxide upon any Group IV semiconductor material, including germanium.

Accordingly, it is an object of the present invention to provide a process for growing a thin oxide film epitaxially upon a substrate comprised of elements from Group IV of the periodic table, and in particular, germanium or silicon.

Another object of the present invention is to provide a structure prepared by the process of the invention.

Yet another object of the present invention is to provide a structure which is well-suited for use in semiconductor and related applications.

A further object of the present invention is to provide a ferroelectric field effect transistor which embodies the structure of this invention.

SUMMARY OF THE INVENTION

This invention resides in improvements to a structure and to an associated process for growing a crystalline oxide epitaxially upon the surface of a Group IV semiconductor substrate comprised of germanium or silicon and wherein the process includes the steps of depositing an alkaline earth oxide or an alkaline earth-containing perovskite oxide upon the substrate surface in a layer-by-layer build-up and wherein the alkaline earth oxide or alkaline earth-containing perovskite oxide includes an alkaline earth metal.

The improvement of the process is characterized in that prior to the initiation of a build-up of a first oxide layer upon the substrate, the substrate surface is passivated against the subsequent reaction with oxygen by forming a monolayer of germanide or silicide.

The structure includes a layup of epitaxial crystalline oxide upon the surface of a Group IV semiconductor substrate comprised of germanium or silicon, and the improvement to the structure is characterized by a monolayer of a germanide or a silicide interposed between the substrate surface and the crystalline oxide.

DETAILED DESCRIPTION OF ILLUSTRATIVE EMBODIMENTS

Since the issuance of applicants' U.S. Pat. No. 5,225,031 which addresses a build-up of a crystalline oxide upon silicon (to avoid native oxide formation, e.g. $SiO_2$), applicants have experimented further with silicon and other elements, such as germanium, of Group IV of the periodic table and have developed generalizations of a process which can be used to build epitaxial, as well as commensurate, crystalline oxides on any Group IV substrate whereby the effects of native oxide formation need not be taken into account. Such a generalization of the process was not possible from the disclosure of U.S. Pat. No. 5,225,031 because the exposure of oxygen to other Group IV materials, and notably germanium, at high temperatures does not result in a native oxide formation, e.g. $GeO_2$ on germanium.

In the paragraphs which follow, an exemplary build up of crystalline oxide on germanium is described. It will be understood, however, that the principles of the present invention can be used for growing oxides on the surface of other Group IV semiconductors.

It is desirable to grow crystalline oxides immediately in contact with Group IV semiconductors; silicon and germanium are examples. Moreover, it is desirable that the crystalline oxide be epitaxial or even perfectly commensurate with the semiconductor. In our previous U.S. Pat. No. 5,225,031, we have shown that avoidance of the amorphous native oxide, $SiO_2$, is required if the crystalline silicon template is to be used for establishing the epitaxial interface.

Figure 1:
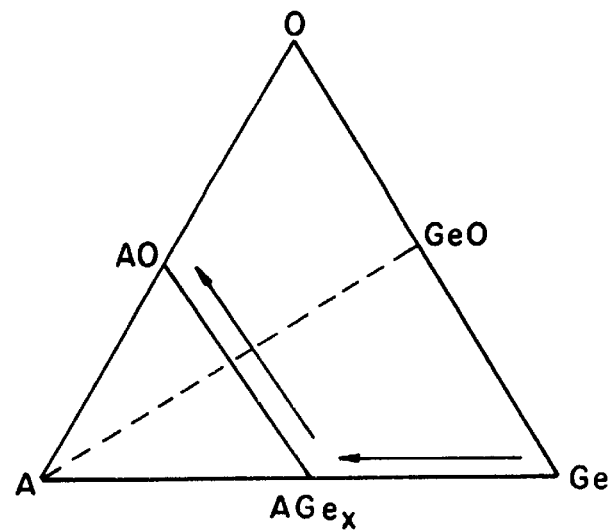
FIG. 1 is a three-component phase diagram.

We have discovered that it is now possible to describe a common process that is applicable to the Group IV semiconductors as a class. There is shown in FIG. 1 the three component phase diagram that is helpful in understanding this process for germanium. The three components are pure germanium (Ge), oxygen (O), and an alkaline earth metal (A). The alkaline earth metal may be any of Ba, Sr, Ca or Mg, but Ba is described as being used with germanium in the exemplary process which follows.

Stable tie-lines between the components are characteristic of the thermodynamic system, e.g. the line at the base of the triangle in FIG. 1 connecting Ge and A. For reaction between Ge and A, we note that compounds form as $AGe_x$ (wherein the variable "x" can be 0.5, 1, or 2, as examples). In attempting to grow a thin-film of AO against Ge following the path indicated by the arrows on the diagram, the interface between Ge and the thin-film AO can be maintained in local thermodynamic equilibrium by first forming $AGe_x$ with no oxygen in the system, and then changing direction in the phase space described in the diagram and going toward the AO compound. To make this change in thermodynamic direction, however, requires that the $AGe_x$ compound be exposed to A and O in appropriate proportions to remain on the stable tie line extending between $AGe_x$ and AO. This concept is the generalization that we can now make in the instant application and which has not been recognized heretofore: layer-by-layer thermodynamic equilibrium can be maintained at the atomic level and thereby form stable, heteroepitaxial transitions from semiconductors to crystalline oxides.

In this connection, a guiding principle of the present invention resides in controlling thermodynamic stability at the atomic level of a multicomponent system during initial stages of interface formation between semiconductors and crystalline oxides. If the semiconductor of interest is silicon or germanium, the formation of a monolayer of silicide or germanide during these initial stages of growth controls the interface electrostatics, interface strain and interface chemical compatibility.

With reference to FIG. 1, there is shown a structure, generally indicated 18, which has been constructed in accordance with an embodiment of the process of the present invention. The structure 18 includes a substrate 20 of pure germanium (a Group IV element), an overlayer 23 of germanide, a fraction, or fragment 25, of a monolayer of an alkaline earth metal, an overlayer 29 of alkaline earth oxide, and then an overlayer 31 of perovskite oxide. In the depicted structure 20, the alkaline earth metal of the monolayer fragment 25 is barium (Ba) and the perovskite oxide overlayer 31 (which includes the alkaline earth oxide metal barium) is $BaTiO_3$. As will be apparent herein, steps are taken to passivate the surface, indicated 22, of the substrate 20 by exposing the surface 22 to a submonolayer of Ba which reacts the germanium of the substrate 20 to form the monolayer 23 of germanide which, in turn, passivates the substrate surface against the subsequent reaction with oxygen.

At the outset of a process performed with the present invention, the surface 22 of the germanium substrate 20 is cleaned to atomic cleanliness so that only germanium atoms are present at the surface 22. To this end, the surface 22 is cleaned by a process commonly referred to as a Modified RCA technique. The Modified RCA technique is a well-known process involving the chemical production of an oxide at a germanium surface being cleaned and subsequently placing the surface in a high vacuum environment and raising the temperature of the surface to sublime the oxide off of the surface.

Figure 3:
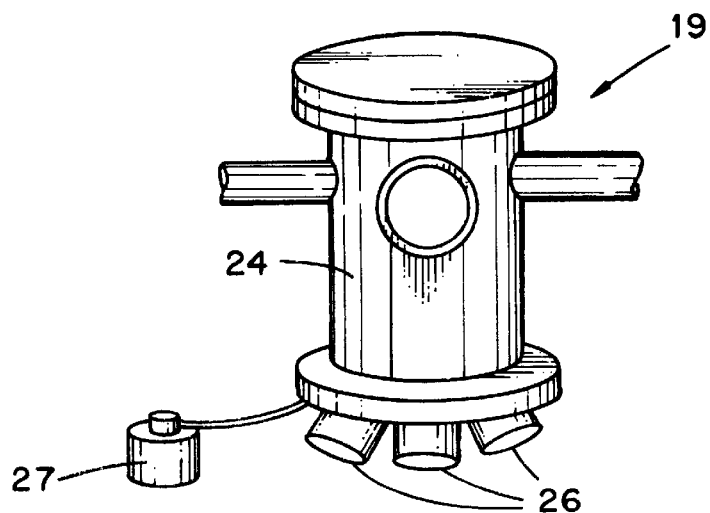
FIG. 3 is a schematic perspective view of ultra high vacuum equipment with which steps of the present invention can be performed.

The equipment used for creating a high vacuum environment about the substrate 20 is an ultra high vacuum (UHV) molecular beam epitaxy (MBE) facility, a fragment of which is indicated 19 in FIG. 3. The facility 19 includes a container 24 having an inner chamber within which the substrate 20 is positioned so that its surface 22 faces downwardly, and a plurality of canisters 26 are mounted within the base of the container 24 for providing a vapor source of metals desired to be added to the substrate surface 22 during the process of the present invention. In this connection, each canister 26 is adapted to hold a crucible containing a desired metal and contains heating elements for vaporizing the metal. An opening is provided in the top of each canister 26, and a shutter is associated with the canister opening for movement between a closed condition at which the interior of the container 24 is closed and thereby isolated from the substrate surface 22 and an opened condition at which the contents of the container 24, i.e. the metal vapor, is exposed to the substrate surface 22. In addition, an oxygen source 27 is connected to the chamber so that by opening and closing a valve associated with the source 27, oxygen may be delivered to or shut off from the chamber. The opening and closing of each canister shutter and the oxygen source valve is accurately controlled by a computer controller (not shown).

One other feature of the facility 19 is that a closable substrate shutter is disposed immediately below the downwardly-directed face of the substrate surface 20 for isolating, when desired, the substrate surface 20 from exposure to the metal vapors from the canisters 24 or the oxygen from the oxygen source 27 while the internal pressure of the facility chamber is raised with the oxygen from the source 27. The substrate shutter is closed during one step of the present process as will be apparent herein.

The vacuum drawn in the UHV facility 19 to complete the Modified RCA cleaning technique upon the substrate 20 is between about $10^{-9}$ and $10^{-10}$ torr, and the substrate 20 is heated to raise the substrate surface temperature to a temperature sufficient to drive the oxides off of the surface 22. In practice, such a temperature may be between about 420° C. and 500° C. for germanium, and the desired surface cleanliness may be confirmed in-situ during the substrate heating operation by Reflection High Energy Diffraction (RHEED) techniques. Briefly, a RHEED technique uses a high energy electron beam to diffract electrons off of the substrate surface 22 at a glancing angle, typically 10 kev at an incidence angle of 1 to 2 degrees. The diffraction of the electrons provides crystallographic information while the limited penetration of the electron beam provides information relating to the flatness of the film surface. A flat surface is characterized by rods of scattered intensity perpendicular to the film intersecting the normal Bragg reflections of the crystal structure. For present purposes, the germanium substrate 20 reaches atomic cleanliness upon the development of 2×1 Ge(100) at the surface 22 as evidenced by RHEED analysis.

At that point, the metal (or element) barium (Ba) is deposited upon the substrate surface 22 of germanium (Ge) so that a fraction, e.g. about one-fourth, of a monolayer of Ba covers the substrate surface 22. In other words, the Ba metal is deposited upon the substrate surface 22 until about one atom of the Ba metal overlies the germanium surface for every four atomic sites of Ge. To this end, a vapor of the metal Ba is created in one of the canisters 24 (FIG. 3) and the appropriate canister shutter is opened to expose the clean substrate surface 22 to the vapor of Ba metal. As mentioned earlier, the operation of the canister shutter is controlled by a computer controller to accurately control the amount that the Ba metal is deposited upon the surface 22. Once the exposure of the substrate 22 to the Ba metal is sufficient to provide the desired fraction of the monolayer of the Ba metal, the canister shutter is closed. This fraction of the monolayer of Ba reacts with the germanium of the substrate surface 22 to form the desired monolayer 23 of germanide. The aforedescribed one-fourth monolayer of Ba is believed to result in the optimum germanide stoichiometry. However, a fraction of a monolayer of Ba in the range of between one-sixth and one-half of a monolayer is believed to provide a germanide stoichiometry which is consistent with the teachings of this principle.

The substrate 20 is then cooled to about 200° to 300° C. while the high vacuum environment is maintained about the substrate 20. With reference to the phase diagram of FIG. 1, this action permits the thermodynamic path from the germanide to the alkaline earth oxide (i.e. the compound AO on the FIG. 1 diagram) to be completed, thereby enabling the epitaxial growth of the crystalline oxide from the germanide template. To make this change in thermodynamic direction, oxygen and the alkaline earth metal "A", in this case Ba, can be co-deposited or shuttered in appropriate proportions to remain on the stable tie line extending between $AGe_x$ and AO as the thin film AO grows heteroepitaxially on the germanide.

To effect this change in the thermodynamic path going from the germanide to the oxide, the alkaline earth metal, Ba, is first deposited in the absence of oxygen to approximately one-half monolayer and then oxygen and Ba are co-deposited to an additional one-half monolayer to provide the first full monolayer with alkaline earth oxide. Thereafter, the growth of the alkaline earth oxide can be continued as a pure compound or a transition to an alkaline earth-containing perovskite oxide can be made by alternately shuttering the alkaline earth and transition metal sources. If the purpose of the growth of the perovskite oxide is for a transistor application or other high dielectric constant capacitor applications, e.g. DRAM (dynamic random access memory), various growth techniques can now be employed, e.g. MBE, MOCVD, laser ablation, and sputter deposition. Additional information relative to the growth of perovskite oxides can be found in U.S. Pat. Nos. 5,821,199 and 5,830,270, the disclosures of which are incorporated herein by reference.

Figure 4:
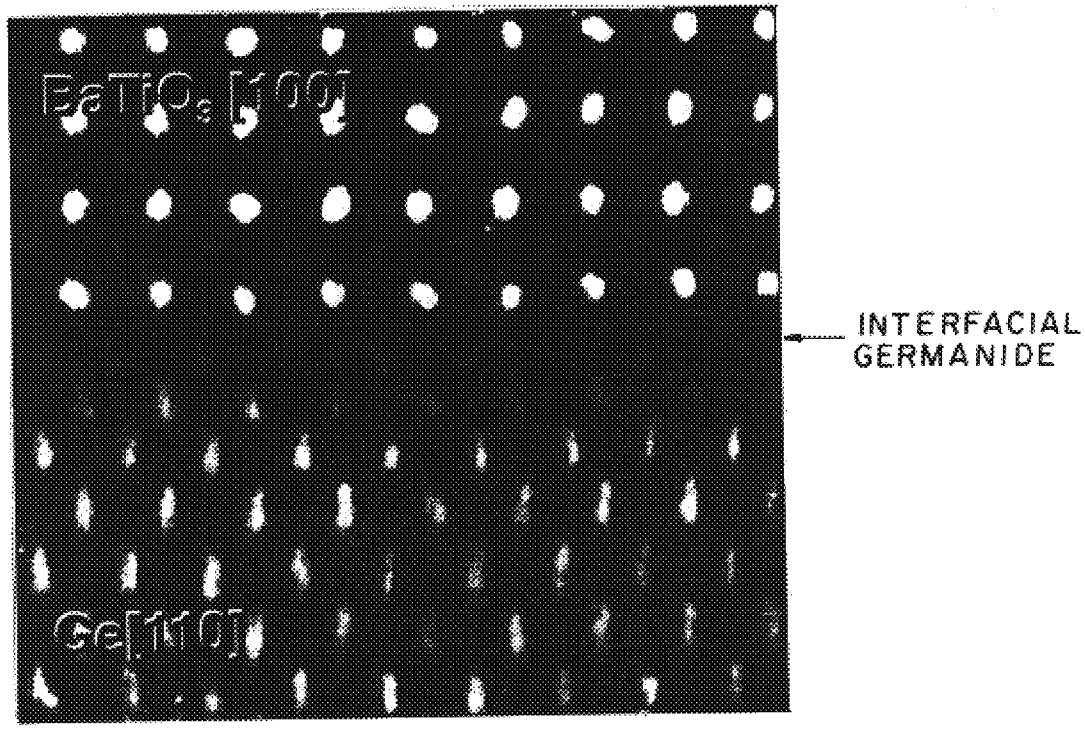
FIG. 4 is a scanning transmission electron microscope (STEM) image of a cross section of a crystalline oxide-on-germanium structure showing a one-monolayer germanide interposed between the crystalline oxide (of $BaTiO_3$) and the semiconductor, germanium.

There is shown in FIG. 4 a STEM image of a cross section of a BaTiO$_3$/germanium structure illustrating the interfacial germanide constructed in accordance with the afore-described process applied in a molecular beam epitaxy machine. It can be seen from this image that a perfectly commensurate interface between the crystalline oxide and the semiconductor is obtained.

Device considerations

Figure 5:
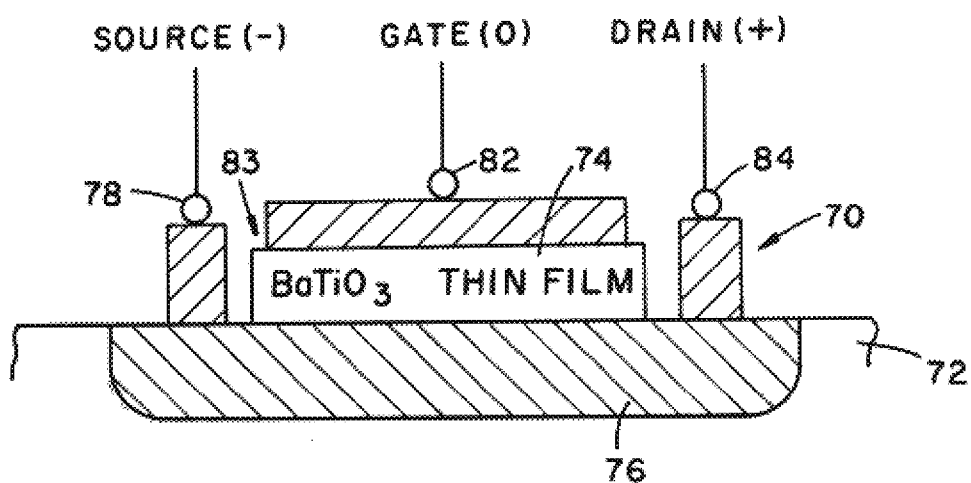
FIG. 5 is a schematic cross-sectional view of a fragment of a ferroelectric field effect transistor (FFET) utilizing a perovskite thin film as a gate dielectric.

Pure germanium substrates can be advantageously used in semiconductor devices wherein a crystalline oxide has been built up epitaxially upon the germanium substrate. For example, there is shown in FIG. 5 an embodiment of a ferroelectric field effect transistor (FFET), indicated 70, including a base, or substrate 72 of germanium and an overlayer 74 of the perovskite BaTiO$_3$. During construction of the transistor 70 and prior to the deposition of the BaTiO$_3$ overlayer 74 upon the substrate 72, a monolayer of germanide is formed at the substrate surface so that upon completion of the transistor 70, the monolayer of germanide is interposed between the surface of the substrate 72 and the BaTiO$_3$ overlayer 74.

The transistor 70 is also provided with a source electrode 78, a drain electrode 84, a gate electrode 82, and a gate dielectric 83. The BaTiO$_3$ thin film 74 (which comprises the gate dielectric 83) is sandwiched between the epilayer 76 and the gate electrode 82 so as to be positioned adjacent the epilayer 76. Since ferroelectric materials possess a permanent spontaneous electric polarization (electric dipole moment per cubic centimeter) that can be reversed by an electric field, the ferroelectric dipoles can be switched, or flipped, and the charge density and channel current can be modulated. Thus, the transistor 70 can be turned ON or OFF by the action of the ferroelectric polarization, and if used as a memory device, the transistor 70 can be used to read the stored information (+or –, or "1" or "0") without ever switching or resetting (hence no fatigue).

Figure 2:
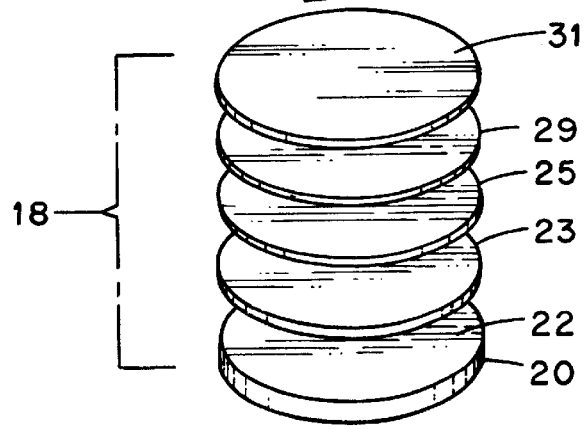
FIG. 2 is a perspective view of an embodiment of a structure, shown exploded, which has been constructed in accordance with an embodiment of the process of this invention.

It will be understood that numerous modifications and substitutions can be had to the aforedescribed embodiments without departing from the spirit of the invention. For example, although the crystalline oxide layer 31 of the FIG. 2 structure 18 is described as comprised of the perovskite oxide BaTiO$_3$, the crystalline oxide can be generically represented by the formula $(AO)_n(A'BO_3)_m$ wherein "n" and "m" are non-negative integers (i.e. any number from the set $\{0, 1, 2, 3, 4, \ldots\}$), "A" and "A'" can be any element of Group IA, IIA or IVB of the periodic table, and "B" is an element found in Group III, IVA or VA of the periodic table. Accordingly, the aforedescribed embodiments are intended for the purpose of illustration and not as limitation.

What is claimed is:

1. In a process for growing a crystalline oxide epitaxially upon the surface of a Group IV semiconductor substrate comprised of germanium and wherein the process includes the steps of depositing an alkaline earth oxide or an alkaline earth-containing perovskite oxide upon the germanium substrate surface in a layer-by-layer build-up and wherein the alkaline earth oxide or alkaline earth-containing perovskite oxide includes an alkaline earth metal, the improvement comprising the steps of:

passivating the germanium substrate surface against the subsequent reaction with oxygen by forming a monolayer of germanide prior to the initiation of a build-up of a first oxide layer upon the germanium substrate.

2. The improvement of claim 1 wherein the step of passivating is affected by either depositing the alkaline earth metal upon the substrate surface to a submonolayer coverage so that the alkaline earth metal reacts with the substrate material to form a monolayer coverage of the germanide or by co-depositing the alkaline earth metal with germanium in the appropriate germanide compositions to render a deposited monolayer of the germanide.

3. The improvement of claim 2 wherein the monolayer of germanide is obtained in the passivating step by reacting an amount of alkaline earth metal at the semiconductor surface equivalent to between about one-sixth and one-half of a monolayer of the alkaline earth metal.

4. The improvement of claim 3 wherein the stoichiometry of the germanide monolayer effected by the passivating step is optimized at a coverage of the substrate surface of about one-fourth of a monolayer of alkaline earth metal.

* * * * *